United States Patent
Adusumilli et al.

(10) Patent No.: US 8,415,677 B2
(45) Date of Patent: Apr. 9, 2013

(54) FIELD-EFFECT TRANSISTOR DEVICE HAVING A METAL GATE STACK WITH AN OXYGEN BARRIER LAYER

(75) Inventors: Praneet Adusumilli, Evanston, IL (US); Alessandro Callegari, Yorktown Heights, NY (US); Josephine B. Chang, Mahopac, NY (US); Changhwan Choi, Edgewater, NJ (US); Martin Michael Frank, Dobbs Ferry, NY (US); Michael A. Guillorn, Yorktown Heights, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 434 days.

(21) Appl. No.: 12/690,178

(22) Filed: Jan. 20, 2010

(65) Prior Publication Data

US 2011/0175147 A1     Jul. 21, 2011

(51) Int. Cl.
    *H01L 29/04*   (2006.01)
(52) U.S. Cl.
    USPC ..................... 257/72; 257/E27.111
(58) Field of Classification Search .............. 257/59, 257/72, E27.111
    See application file for complete search history.

(56) References Cited

U.S. PATENT DOCUMENTS

| | | | |
|---|---|---|---|
| 6,274,899 B1 | 8/2001 | Melnick et al. | |
| 6,358,855 B1 | 3/2002 | Ramachandran et al. | |
| 6,511,876 B2 | 1/2003 | Buchanan et al. | |
| 7,053,436 B2 | 5/2006 | Nagano et al. | |
| 7,400,006 B1 | 7/2008 | Rinerson et al. | |
| 7,501,336 B2 | 3/2009 | Doyle et al. | |
| 2005/0205947 A1* | 9/2005 | Yu et al. | 257/410 |
| 2005/0285208 A1* | 12/2005 | Ren et al. | 257/388 |
| 2006/0261338 A1* | 11/2006 | Yamazaki et al. | 257/59 |
| 2006/0270205 A1 | 11/2006 | Ku et al. | |
| 2007/0069311 A1 | 3/2007 | Adetutu et al. | |
| 2008/0224236 A1* | 9/2008 | Ren et al. | 257/407 |
| 2009/0085126 A1 | 4/2009 | Yu et al. | |

FOREIGN PATENT DOCUMENTS

WO    WO2006032300    3/2006

OTHER PUBLICATIONS

Suh, Youseok. "Fabrication and evaluation of devices containing high K gate dielectrics and metal gate electrodes for the 70 and 50nm technology nodes of ITRS", Dissertation, North Carolina State University, vol. 6501B, p. 371+, 2003.
Callegari, A. et al., "Thermal Stability of HfN Compounds on HfO2;SiO2 Gate Stacks", ECS Cancun, Mexico, 2006.
Scansen, D., "Under the Hood: 45nm: What Intel didn't tell you", EETimes Online, 2008.
Peters. L., "Physical Analysis Provides Images of 45 nm", Semiconductor International, 2008.

* cited by examiner

*Primary Examiner* — Thomas L Dickey
(74) *Attorney, Agent, or Firm* — Law Offices of Ira D. Blecker, P.C.

(57) ABSTRACT

A field effect transistor device and method which includes a semiconductor substrate, a dielectric gate layer, preferably a high dielectric constant gate layer, overlaying the semiconductor substrate and an electrically conductive oxygen barrier layer overlaying the gate dielectric layer. In one embodiment, there is a conductive layer between the gate dielectric layer and the oxygen barrier layer. In another embodiment, there is a low resistivity metal layer on the oxygen barrier layer.

15 Claims, 4 Drawing Sheets

FIELD-EFFECT TRANSISTOR DEVICE HAVING A METAL GATE STACK WITH AN OXYGEN BARRIER LAYER

BACKGROUND OF THE INVENTION

The present invention relates in general to methods of fabrication and semiconductor structures, more particularly, to Field-Effect Transistor (FET) structures in metal gate technology having an electrically conductive oxygen barrier layer and most particularly, to FET structures in high dielectric constant (high K), metal gate technology having an electrically conductive oxygen barrier layer.

In the field of semiconductor devices, it is well known to form FETs having a gate, source and drain. Typically, the gate is formed by depositing a layer of silicon dioxide ($SiO_2$) or silicon oxynitride (SiON), constituting a gate insulator layer, upon a silicon substrate and then depositing a poly-crystalline silicon ('polysilicon') layer, constituting a gate electrode layer, upon the gate insulator layer. The gate electrode layer, and optionally the gate insulator layer, is then etched to form an appropriately shaped gate.

Silicon dioxide and silicon oxynitride as a gate oxide and polysilicon as the gate electrode have been the standard materials for FETs. As transistors have decreased in size, the thickness of the silicon dioxide gate dielectric had to decrease steadily as well, to maintain good electrostatic control over the FET channel. However, with the thinning of the silicon dioxide comes the problem of leakage currents due to tunneling through the silicon dioxide.

To further reduce FET size, advanced technology processes use high-K dielectric materials for the gate dielectric layer along with metals other than polysilicon for the gate electrode. Such devices may be referred to as high-K/metal gate (HKMG) FETs. The high-K gate dielectric layer is generally deposited on a silicon substrate (with an optional interfacial layer present, for example SiO2 or SiON), and a metal gate electrode is formed on the high-K gate dielectric layer. Replacing the silicon dioxide dielectric with a high-K material reduces the leakage effects mentioned above, while improving electrostatic control over the channel.

BRIEF SUMMARY OF THE INVENTION

The present inventors have recognized that particularly with regard to high-K, metal gate FET structures, undesirable regrowth of silicon dioxide ($SiO_2$) at the high-K dielectric/silicon interface can occur during dopant activation anneal. Such silicon dioxide formation degrades (increases) Capacitance Equivalent Thickness (CET) and Equivalent Oxide Thickness (EOT). The regrowth of silicon dioxide is due to oxygen diffusion in the gate stack.

All known solutions to fabricating low-resistance metal gate/high-K FETs with minimum undesirable SiO2 formation involve a Si capping layer in place during activation anneal.

It would be desirable to fabricate FETs with metal gate electrodes not containing any silicon layer ("full metal gate") during dopant activation anneal, i.e. in a so-called "gate-first" integration scheme. Such a metal gate/high-K integration is highly desirable, as it may, for example, enable fabrication of self-aligned source-drain contacts, reducing variability concerns with continued pitch scaling.

Accordingly, the present inventors have proposed a conductive, non-silicon oxygen barrier in the gate stack to control the diffusion of oxygen.

Further, the inventors have addressed the issue of gate line resistivity. To resolve this issue, the present inventors have proposed a gate stack including both a conductive non-silicon oxygen barrier and a low-resistivity metal layer.

The various advantages and purposes of the present invention as described above and hereafter are achieved by providing, according to a first aspect of the invention, a field effect transistor device including a semiconductor substrate, a gate stack which includes a gate dielectric layer overlaying the semiconductor substrate, an electrically conductive oxygen barrier layer overlaying the gate dielectric layer, and a low resistivity metal layer overlaying the oxygen barrier layer, wherein each layer in the gate stack has less than 90 atom percent of silicon, germanium or silicon and germanium combined. The field effect transistor device further includes a spacer adjacent to the gate stack and in direct contact with the gate stack.

According to a second aspect of the invention, there is provided a field effect transistor device which includes a semiconductor substrate, a high dielectric constant gate dielectric layer overlaying the semiconductor substrate, a metal gate layer overlaying the high dielectric constant gate dielectric layer, and a hafnium nitride oxygen barrier layer overlaying the metal gate layer.

According to a third aspect of the invention, there is provided a method for fabricating a field effect transistor device which includes the steps of forming a gate stack on a semiconductor substrate and performing a dopant anneal. Forming the gate stack includes the steps of forming a gate dielectric layer over the semiconductor substrate, forming an electrically conductive oxygen barrier layer over the gate dielectric layer, forming a low resistivity layer over the oxygen barrier layer, wherein each layer in the gate stack has less than 90 atom percent of silicon, germanium or silicon and germanium combined.

According to a fourth aspect of the invention, there is provided a method for fabricating a field effect transistor device which includes forming a gate stack on a semiconductor substrate and performing a dopant activation anneal. Forming the gate stack includes the steps of forming a high dielectric constant gate dielectric layer over the semiconductor substrate, and forming an electrically conductive oxygen barrier layer over the gate dielectric layer, wherein each layer in the gate stack has less than 90 atom percent of silicon, germanium or silicon and germanium combined.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
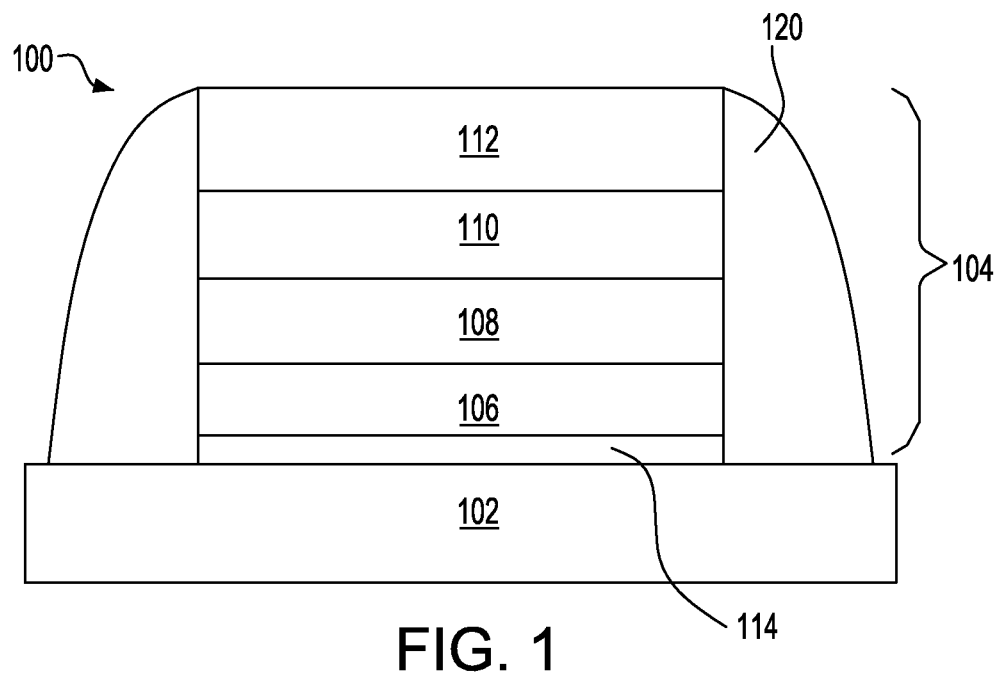
FIG. 1 is a cross sectional view of a first embodiment of the present invention showing a gate stack having an electrically conductive oxygen barrier layer for a semiconductor device.

Referring now to the Figures in more detail, and particularly referring to FIG. 1, there is shown a first embodiment 100 of a gate stack having an oxygen barrier. As shown in FIG. 1, semiconductor substrate 102 has a gate stack 104. The semiconductor material making up the semiconductor substrate 102 can be any semiconductor material, including but not limited to, silicon, silicon germanium, germanium, a III-V compound semiconductor, or a II-VI compound semiconductor. The present invention has applicability to both silicon-on-insulator (SOI) and bulk semiconductor technology.

The gate stack 104 comprises several layers of material including a gate dielectric layer 106, an electrically conductive oxygen barrier layer 110 and a low resistivity metal layer 112. The gate dielectric layer 106 may be a dielectric layer like silicon dioxide or silicon oxynitride but most preferably is a high-K dielectric layer, i.e. a dielectric layer with a higher dielectric constant than silicon dioxide including at least one metallic element, such as hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_2O_3$), lanthanum aluminate ($LaAlO_3$), zirconium silicate ($ZrSiO_x$), and any other dielectric material having a dielectric constant higher than that of silicon dioxide ($SiO_2$: dielectric constant 3.9). The high-K dielectric layer may comprise 2 or more sublayers. The high-K layer 106 should have an approximate thickness of 10 to 40 angstroms.

Some examples of materials suitable for an electrically conductive oxygen barrier layer 110 include, for purposes of illustration and not limitation, titanium aluminum nitride (TiAlN), tantalum aluminum nitride (TaAlN), tantalum silicon nitride (TaSiN), titanium silicon nitride (TiSiN), hafnium (Hf), zirconium (Zr), hafnium silicide (HfSix), zirconium silicide (ZrSix), titanium silicide (TiSix), niobium-doped titanium silicide, tungsten silicide (WSix), hafnium nitride (HfN), hafnium silicon nitride (HfSiN), zirconium nitride (ZrN), and titanium hafnium nitride (TiHfN). The oxygen barrier layer 110 should be able to withstand temperatures in excess of 950 degrees Centigrade and be conductive so as to have a resistivity that is typically less than 1000 microohm-centimeter (μohm-cm). The thickness of the electrically conductive oxygen barrier layer may typically be 10 to 300 angstroms.

On top of the electrically conductive oxygen barrier layer 110 may be formed a low resistivity metal layer 112 which preferrably should have a sheet resistance of less than 50 ohm/sq and more preferrably less than 15 ohm/sq. Some examples of materials suitable for the low resistivity metal layer 112 include, but are not limited to, tungsten (W), copper (Cu), tantalum (Ta), titanium (Ti), niobium, titanium silicide, nickel silicide, cobalt silicide, nickel platinum silicide, titanium aluminide (TixAly), tantalum aluminide (TaxAly) and mixtures thereof. Most preferably the low resistivity metal layer 112 comprises tungsten or tantalum. The thickness of the low resistivity metal layer 112 may typically be 50 to 800 angstroms.

It may be desirable to include an optional conductive layer 108 between the dielectric layer 106 and the electrically conductive oxygen barrier layer 110. Some examples of materials suitable for the optional conductive layer 108 include but are not limited to titanium nitride (TiN), tantalum nitride (TaN), titanium silicon nitride (TiSiN), tantalum silicon nitride (TaSiN), titanium carbide (TiC), tantalum carbide (TaC or $Ta_2C$) and combinations thereof. The thickness of the optional conductive layer 108 may typically be 10 to 100 angstroms.

There may also be a thin (typically less than 15 angstrom thick) layer 114 of silicon dioxide ($SiO_2$) or silicon oxynitride on the silicon substrate 102. The thin layer 114 of silicon dioxide or silicon oxynitride may occur as a result of thermal processing, either before or after the addition of the gate stack 104. The present invention seeks to avoid increasing the thin layer 114 of silicon dioxide or silicon oxynitride by incorporating an electrically conductive oxygen barrier layer 110 into the gate stack 104 to retard the diffusion of oxygen to the thin layer 114 of silicon dioxide or silicon oxynitride. If the gate dielectric layer 106 is silicon dioxide or silicon oxynitride, the thickness of the gate dielectric layer 106 would include the thickness of the thin layer 114 of silicon dioxide or silicon oxynitride.

The gate stack 104 may further include spacers 120 of an insulating oxide or nitride compound, for example SiO2, Si3N4, Al2O3, HfO2, or ZrO2, or of mixtures or multilayers thereof, where the spacers 120 most preferably are in direct contact with all layers of the gate stack 104.

Most preferably, the gate stack 104 does not include any layer in the gate stack 104 which has more than 90 atom percent of silicon, germanium or silicon and germanium combined.

Figure 2:
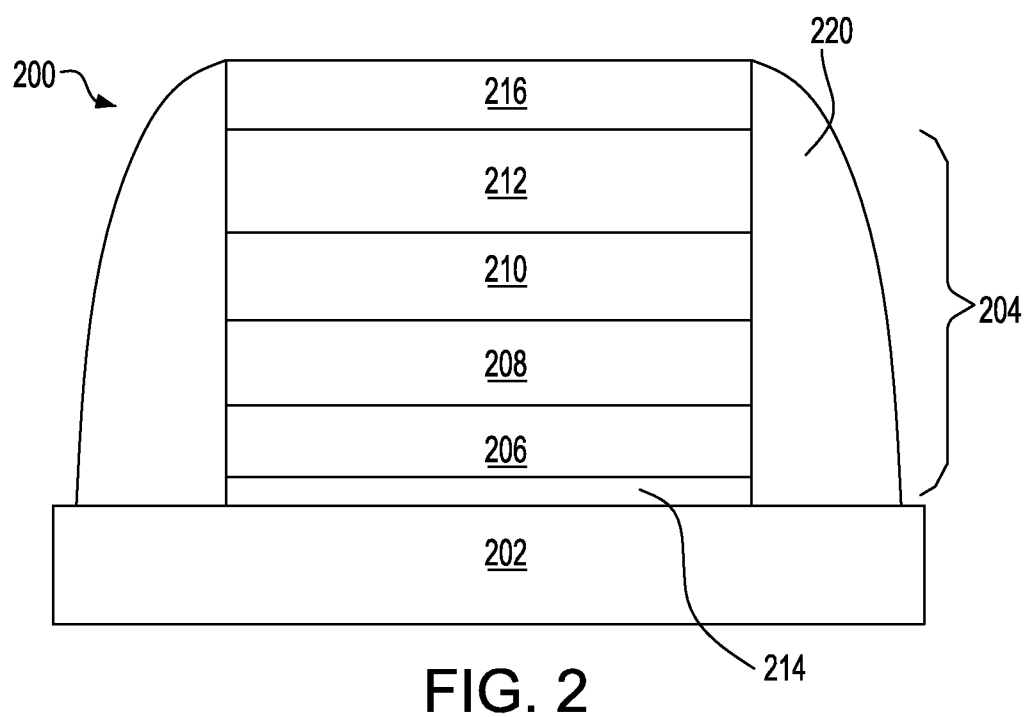
FIG. 2 is a cross sectional view of a second embodiment of the present invention showing a gate stack having an electrically conductive oxygen barrier layer for a semiconductor device.

Referring now to FIG. 2, there is shown a second embodiment 200 of a gate stack having an oxygen barrier. In the second embodiment 200, there is a substrate 202 similar to substrate 102 in FIG. 1 having a gate stack 204. The gate stack 204 includes a gate dielectric layer 206 which most preferably is a high-K dielectric layer similar to the gate dielectric layer 106 in FIG. 1. On top of the gate dielectric layer 206 is an electrically conductive oxygen barrier layer 210 similar to the electrically conductive oxygen barrier layer 110 discussed with respect to FIG. 1. The gate stack 204 further includes a low resistivity metal layer 212 similar to the low resistivity metal layer 112 in FIG. 1. The gate stack 204 additionally includes a capping layer 216 to protect the gate stack 204 during further processing of the gate stack 204 and substrate 202. The capping layer 216 may be removed later, if desired, after certain steps of the processing have occurred. The capping layer 216 should be made of a low resistivity material such as titanium nitride (TiN), tantalum nitride (TaN), titanium silicon nitride (TiSiN), tantalum silicon nitride (TaSiN), titanium carbide (TiC), tantalum carbide (TaC, $Ta_2C$), tungsten nitride (WN) and combinations thereof and should typically have a thickness of 10-100 A. In addition, it may be desirable to have an optional conductive layer 208 inserted between the gate dielectric layer 206 and the conductive oxygen barrier layer 210. The optional electrically conductive layer 208 is similar to the optional conductive layer 108 in FIG. 1.

The substrate 202, gate dielectric layer 206, optional conductive layer 208, electrically conductive oxygen barrier layer 210 and low resistivity metal layer 212 of the second embodiment 200 of the gate stack having an electrically conductive oxygen barrier layer may be made of the same materials and the same thickness of materials as the gate dielectric layer 106, optional conductive layer 108, electrically conductive oxygen barrier layer 110 and low resistivity metal layer 112 of the first embodiment 100 of the gate stack having an oxygen barrier layer.

The gate stack 204 may further include a thin layer 214 (less than 15 angstroms thick) of silicon dioxide as described previously with respect to FIG. 1. The present invention seeks to avoid increasing the thin layer 214 of silicon dioxide by incorporating an electrically conductive oxygen barrier layer 210 into the gate stack 204 to retard the diffusion of oxygen to the thin layer 214 of silicon dioxide.

The gate stack 204 may further include spacers 220 of an insulating oxide or nitride compound, for example SiO2, Si3N4, Al2O3, HfO2, or ZrO2, or of mixtures or multilayers thereof, where the spacers 220 most preferably are in direct contact with all layers of the gate stack 204.

Most preferably, the gate stack 204 does not include any layer in the gate stack 204 which has more than 90 atom percent of silicon, germanium or silicon and germanium combined.

Figure 3:
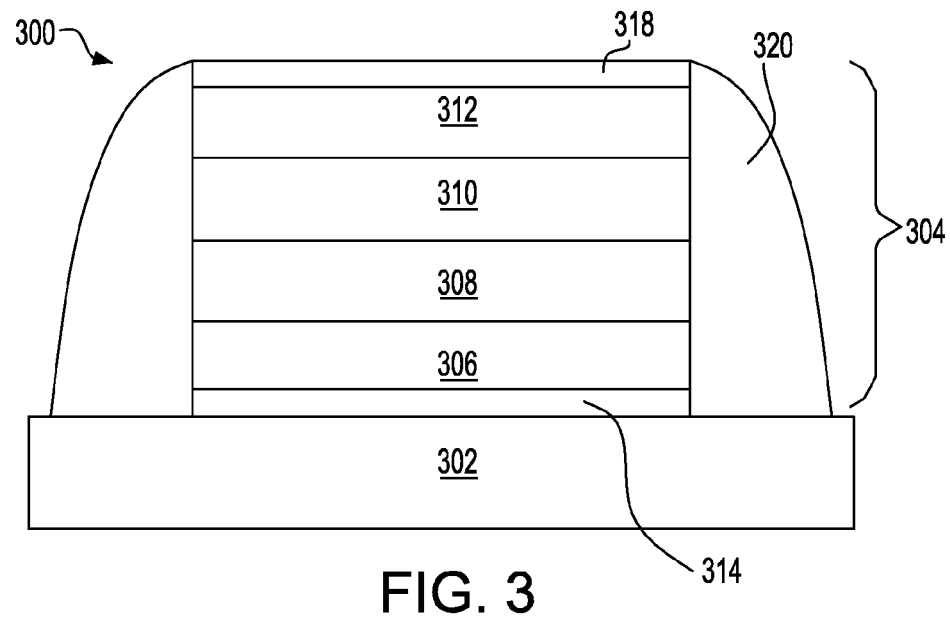
FIG. 3 is a cross sectional view of a third embodiment of the present invention showing a gate stack having an electrically conductive oxygen barrier layer for a semiconductor device.

Referring now to FIG. 3, there is shown a third embodiment 300 of a gate stack having an oxygen barrier. Substrate 302 is the same as substrate 102 in FIG. 1. Gate stack 304 comprises a dielectric layer 306, optional conductive layer 308, conductive oxygen barrier layer 310 and low resistivity metal layer 312 which are the same as dielectric layer 106, optional conductive layer 108, conductive oxygen barrier layer 110 and low resistivity metal layer 112 of gate stack 104 in FIG. 1.

As further shown in FIG. 3, the third embodiment 300 includes an encapsulation layer 318 on the top of the gate stack 304, and spacers 320 of an insulating oxide or nitride compound, for example SiO2, Si3N4, Al2O3, HfO2, or ZrO2, or of mixtures or multilayers thereof, where the spacers 320 most preferably are in direct contact with all layers of the gate stack 104. The combination of the encapsulation layer 318 and the spacers 320 substantially encapsulate the gate stack. The encapsulation layer 318 may be made of an insulating compound such as for example silicon nitride (Si$_3$N$_4$), aluminum oxide (Al$_2$O$_3$), hafnium oxide (HfO2), or zirconium oxide (ZrO2) and have a thickness of 10 to 500 angstroms. The encapsulation layer 318 may be made of the same material as the spacers 320, or it may be made of a different material. The encapsulation layer 318 may be partially or completely removed subsequently in processing to make contact to the gate line. For example, the encapsulation layer 318 may be opened up in a subsequent step so as to make contact with the gate line. A particular advantage of the encapsulation layer 318 is as an enabler for self-aligned source/drain contacts. In this case, the encapsulation layer preferrably comprises a material that exhibits a low etch rate when exposed to the etch process used to form the source-drain contact holes.

The gate stack 304 may further include a thin layer 314 (less than 15 angstroms thick) of silicon dioxide as described previously with respect to FIG. 1. The present invention seeks to avoid increasing the thin layer 314 of silicon dioxide by incorporating an electrically conductive oxygen barrier layer 310 into the gate stack 304 to retard the diffusion of oxygen to the thin layer 314 of silicon dioxide.

Most preferably, the gate stack 304 does not include any layer in the gate stack 304 which has more than 90 atom percent of silicon, germanium or silicon and germanium combined.

Figure 4:
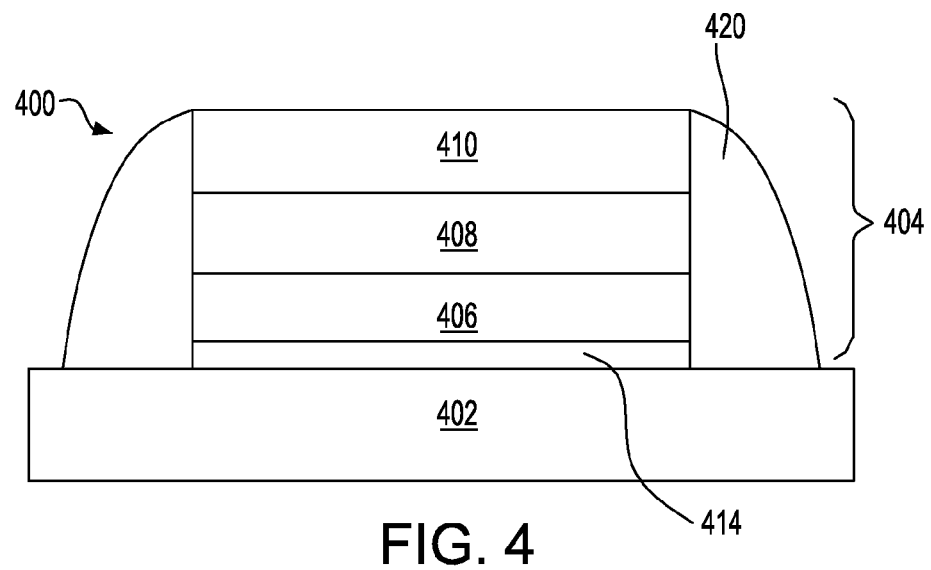
FIG. 4 is a cross sectional view of a fourth embodiment of the present invention showing a gate stack having an electrically conductive oxygen barrier layer for a semiconductor device.

Referring now to FIG. 4, there is shown a fourth embodiment 400 of a gate stack having an oxygen barrier. Substrate 402 is the same as substrate 102 in FIG. 1. Gate stack 404 comprises a high-K gate dielectric layer 406, conductive layer 408 and electrically conductive oxygen barrier layer 410. The gate dielectric layer 406 may be of the same materials and thickness as gate dielectric layer 106 in FIG. 1. The conductive layer 408 may be selected from a material including but not limited to titanium nitride, titanium carbide, tantalum nitride and tantalum carbide and mixtures thereof. The conductive layer 408 may have a thickness of 10 to 200 angstroms. The electrically conductive oxygen barrier layer 410 is most preferably hafnium nitride (HfN) and may have a thickness of about 100 angstroms. Hafnium nitride has been found to be a very effective oxygen scavenger on high-K dielectrics, thus preventing re-growth of the SiO2 underlying layer. Hafnium nitride thus acts as an oxygen sink (or barrier) preventing SiO2 re-growth. Other metal compounds such titanium nitrides/carbides or tantalum nitrides/carbides which are stable at high temperature (1000 C) do not act as oxygen sink (or barrier) and SiO2 re-growth occurs at high temperature.

The gate stack 404 may further include a thin layer 414 (less than 15 angstroms thick) of silicon dioxide as described previously with respect to FIG. 1. The present invention seeks to avoid increasing the thin layer 414 of silicon dioxide by incorporating a hafnium nitride conductive oxygen barrier layer 410 into the gate stack 404 to retard the diffusion of oxygen to the thin layer 414 of silicon dioxide.

The gate stack 404 may further include spacers 420 of an insulating oxide or nitride compound, for example SiO2, Si3N4, Al2O3, HfO2, or ZrO2, or of mixtures or multilayers thereof, where the spacers 420 most preferably are in direct contact with all layers of the gate stack 404.

Most preferably, the gate stack 404 does not include any layer in the gate stack 404 which has more than 90 atom percent of silicon, germanium or silicon and germanium combined.

Figure 5:
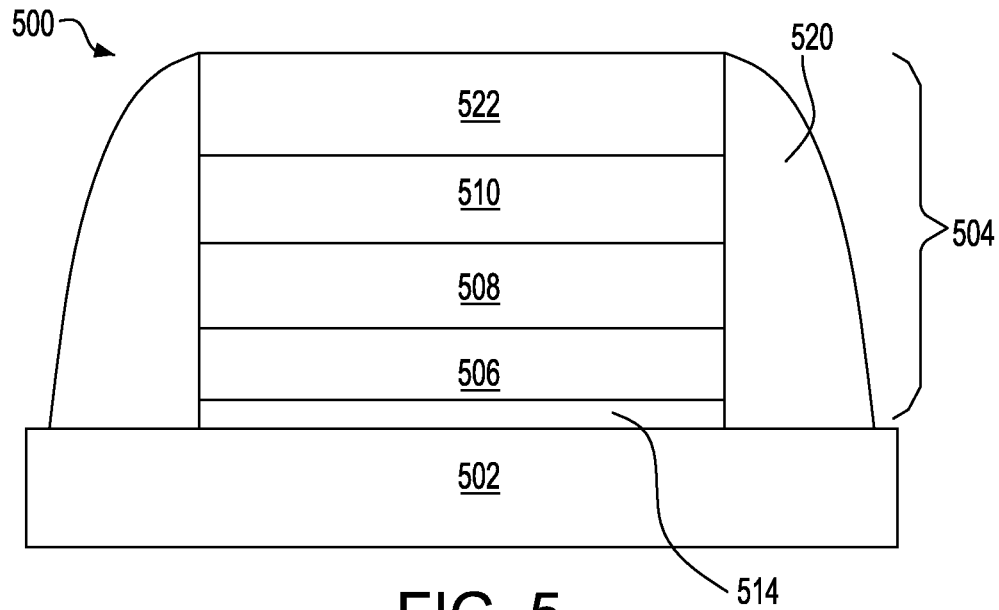
FIG. 5 is a cross sectional view of a fifth embodiment of the present invention showing a gate stack having an electrically conductive oxygen barrier layer for a semiconductor device.

Referring now to FIG. 5, there is shown a fifth embodiment 500 of a gate stack having an oxygen barrier. Substrate 502 is the same as substrate 102 in FIG. 1. Gate stack 504 comprises a high-K dielectric layer 506, conductive layer 508 and hafnium nitride conductive oxygen barrier layer 510 which are the same as high-K dielectric layer 406, conductive layer 408 and hafnium nitride conductive oxygen barrier layer 410 of gate stack 404 in FIG. 4. In addition, the fifth embodiment 500 further includes a conductive layer 522 selected from a material including but not limited to titanium nitride, titanium carbide, tantalum nitride, tantalum carbide and mixtures thereof. The purpose of conductive layer 520 is to prevent oxidation of the hafnium nitride conductive oxygen barrier layer 510 during subsequent processing.

The gate stack 504 may further include a thin layer 514 (less than 15 angstroms thick) of silicon dioxide as described previously with respect to FIG. 1. The present invention seeks to avoid increasing the thin layer 514 of silicon dioxide by incorporating a hafnium nitride conductive oxygen barrier layer 510 into the gate stack 504 to retard the diffusion of oxygen to the thin layer 514 of silicon dioxide.

The gate stack 504 may further include spacers 520 of an insulating oxide or nitride compound, for example SiO2, Si3N4, Al2O3, HfO2, or ZrO2, or of mixtures or multilayers thereof, where the spacers 520 most preferably are in direct contact with all layers of the gate stack 504.

Most preferably, the gate stack 504 does not include any layer in the gate stack 504 which has more than 90 atom percent of silicon, germanium or silicon and germanium combined.

Figure 6:
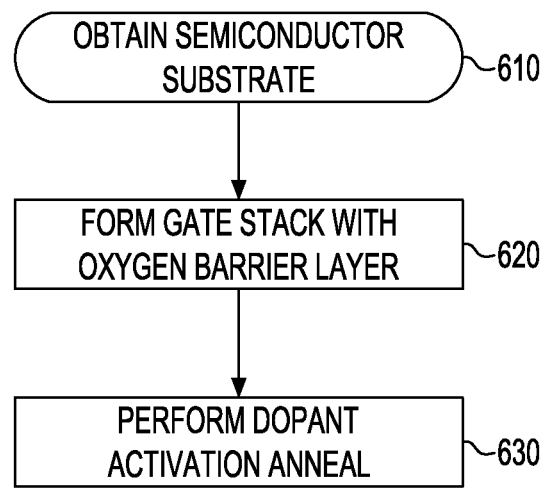
FIG. 6 is a flow chart illustrating an overview of a method for fabricating FET devices according to the present invention.
Figure 7:
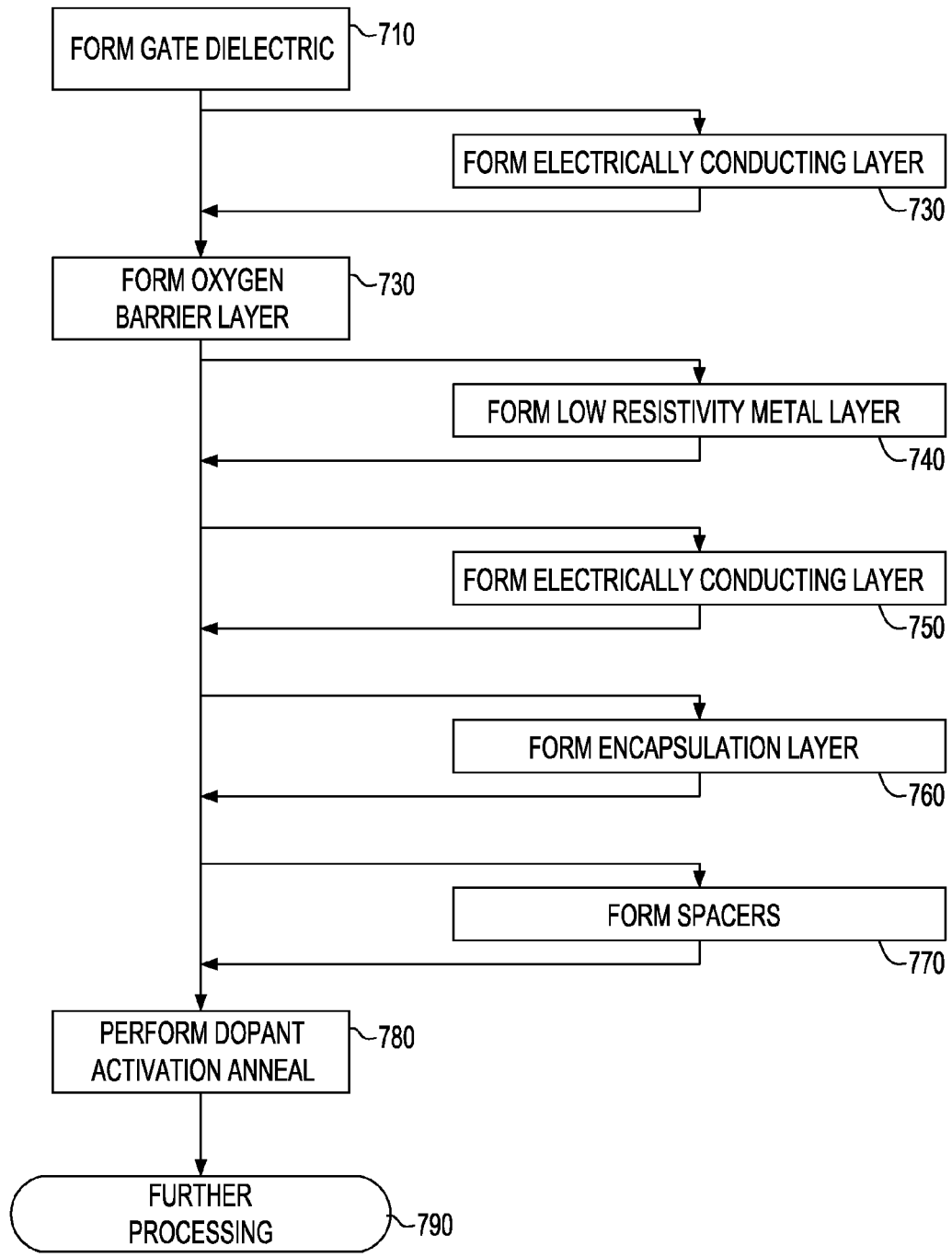
FIG. 7 is a detailed flow chart illustrating a method for fabricating the gate stack of FET devices according to the present invention.

Turning now to FIGS. 6 and 7, the method of the present invention will be discussed. Referring first to FIG. 6, a semiconductor substrate for a field effect transistor is obtained, as indicated in block 610. A gate stack having an electrically conductive oxygen barrier layer is fabricated on the semiconductor substrate, as indicated in block 620. Then, the entire structure of semiconductor substrate and gate stack is subjected to a dopant activation anneal, block 630. The dopant activation anneal is an anneal at a temperature in excess of 950 C. During the dopant activation anneal, the electrically conductive oxygen barrier layer minimizes the formation of undesirable interfacial $SiO_2$ (i.e., layers 114, 214, 314, 414, 514).

Referring now to FIG. 7, the formation of the gate stack will be discussed in more detail. A gate dielectric layer is first formed on the semiconductor substrate, block 710. Most preferably, the gate dielectric layer comprises a high-K dielectric material as discussed above. An electrically conductive oxygen barrier layer is formed over the gate dielectric layer, block 730. In one preferred embodiment, there may be formed a conducting material layer between the gate dielectric layer and the electrically conductive oxygen barrier layer as indicated by block 720. In one preferred embodiment, block 740, a low resistivity metal layer may be formed over the electrically conductive oxygen barrier layer. In another preferred embodiment, there may be formed an electrically conducting cap layer over the low resistivity metal layer, block 750. In yet another preferred embodiment, there may be formed an encapsulation layer 760 over the low resistivity metal layer. In another preferred embodiment, spacers may be formed, preferably in direct contact with all layers of the gate stack layers, as indicated in block 770. The gate stack thus formed on the semiconductor substrate is then subjected to the activation anneal mentioned above, block 780. Thereafter, device processing continues, block 790.

The gate stacks 104, 204, 304, 404, 504 of FIGS. 1 to 5 may be made by conventional deposition and patterning methods. A substrate 102, 202, 302, 402, 502 is prepared according to conventional methods and then the gate dielectric layer 106, 206, 306, 406, 506 is deposited by conventional methods such as metal oxide chemical vapor deposition (MOCVD), sputtering, chemical vapor deposition (CVD) or atomic layer deposition (ALD). The optional conductive layer 108, 208, 308 (FIGS. 1 to 3) or the conductive metal layer 408, 508 (FIGS. 4 to 5) may be deposited, for example, by sputtering, CVD, physical vapor deposition (PVD) or ALD. The electrically conductive oxygen barrier layer 110, 210, 310, 410, 510 may also be deposited by, for example, by sputtering, CVD, MOCVD, or ALD. In the embodiments in FIGS. 1 to 3, the low resistivity metal layer 112, 212, 312 may be deposited by, for example, sputtering, CVD, PVD or ALD. In the embodiment of FIG. 2, the capping layer 216 may be deposited by, for example, sputtering, CVD, PVD or ALD. In the embodiment of FIG. 3, the encapsulation layer 318 may be deposited by, for example, sputtering, CVD, PVD, or ALD. In the embodiment of FIG. 5, the conductive layer 522 may be deposited by, for example, sputtering, CVD, PVD or ALD without breaking a vacuum after deposition of the hafnium nitride oxygen barrier layer.

After the various layers are deposited as described, the stack of deposited layers are patterned and etched by conventional semiconductor processing techniques and then spacers 120, 220, 320, 420, 520 may be added by conventional semiconductor processing techniques to form the gate stacks 104, 204, 304, 404, 504 shown in FIGS. 1 to 5. Thereafter, the various embodiments 100, 200, 300, 400, 500 may undergo conventional semiconductor processing techniques to finish each of the embodiments 100, 200, 300, 400, 500 into semiconductor structures.

EXAMPLES

Example 1

A first sample was made on a silicon wafer having layers of $SiO_2$ interfacial layer (0.9 nm), HfSiOx (30% at. Si) high-K gate dielectric (1.7 nm), TiN (6.4 nm), HfN (9.5 nm) and TaC (12 nm). A second sample was made on a silicon wafer having the same SiO2 interfacial layer (0.9 nm) and HfSiOx (1.7 nm) high-K dielectric and TiN (0.64 nm). Each sample was heated to 1000 degrees Centigrade for 5 seconds to simulate an activation anneal.

Each sample was cross sectioned and examined. The first sample had Capacitance Equivalent Thickness (CET) of 1.45 nm while the second sample had a CET of 1.9 nm. The lower CET number for the first sample, as well as the sharp metal interfaces, indicated that there was no $SiO_2$ regrowth while the second sample did exhibit $SiO_2$ regrowth.

Example 2

A first sample was made on a silicon wafer of SiO2 interfacial layer (5-10 A), HfSiON high-K gate dielectric layer (20 Å), TiN optional conductive metal layer (75 Å), TaAlN oxygen barrier (100 Å), W low resistivity metal layer (125 Å) and $Si_3N_4$ cap (200 Å). A second sample was made on a silicon wafer of HfSiON high-K gate dielectric layer (20 Å), TiN optional conductive metal layer (75 Å), W low resistivity metal layer (125 Å) and $Si_3N_4$ cap (200 Å). There was no electrically conductive oxygen barrier layer in the second sample. Fabrication of both samples included air exposure between TaAlN and W deposition, and between W and Si3N4 deposition, which results in incorporation of oxygen into the TaAlN and W layers. Both samples were heated to 1000 degrees Centigrade for 5 seconds to simulate an activation anneal.

The sheet resistance of the samples was tested. The "as deposited" sheet resistance of the first sample was a desirable 11 to 13 ohm/sq while after heating, the sheet resistance was an even more desirable 9 to 10 ohm/sq. Transmission electron microscopy demonstrated a low density of grain boundaries in the tungsten layer. The sheet resistance of the second sample after heating was an less desirable 20 to 40 ohm/sq. Transmission electron microscopy demonstrated a much higher density of grain boundaries in the tungsten layer, which likely causes the higher sheet resistance. All sheet resistance values observed on the first and second samples are much lower than the sheet resistance of similar stacks without W, indicating that conductivity in the layers is dominated by the W. These result indicate a beneficial impact of the TaAlN layer on W sheet resistance by enabling formation of larger W grains.

In addition, gate stack capacitance of both samples was measured. The first sample had a higher capacitance than the second sample. Transmission electron microscopy demonstrated the presence of a thicker interfacial $SiO_2$ interfacial layer for the second sample, explaining the difference in capacitance. These results indicate detrimental increase in the $SiO_2$ interfacial layer after heating for the second sample without the TaAlN oxygen barrier.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A field effect transistor device comprising:
   a semiconductor substrate;
   a gate stack comprising:
      a gate dielectric layer overlaying the semiconductor substrate;
      an electrically conductive oxygen barrier layer overlaying the gate dielectric layer;
      a low resistivity metal layer overlaying the oxygen barrier layer, wherein each layer in the gate stack has less than 90 atom percent of silicon, germanium or silicon and germanium combined; and
      a conducting material layer between the gate dielectric layer and the oxygen barrier layer;
   a spacer adjacent to the gate stack and in direct contact with each layer of the gate stack; and
   an encapsulation layer on a top of the gate stack and in contact with the low resistivity metal layer, the encapsulation layer adjacent to the spacer and in direct contact with the spacer.

2. The field effect transistor device of claim 1 wherein the gate dielectric layer is a high dielectric constant gate dielectric layer.

3. The field effect transistor device of claim 1 wherein the low resistivity metal layer is selected from the group consisting of tungsten (W) and tantalum (Ta).

4. The field effect transistor device of claim 1 wherein the conducting material layer is selected from the group consisting of titanium nitride, tantalum nitride, titanium silicon nitride, tantalum silicon nitride, titanium carbide, tantalum carbide and combinations thereof.

5. The field effect transistor device of claim 1 wherein the encapsulation layer is selected from the group consisting of silicon nitride, aluminum oxide, hafnium oxide, and zirconium oxide.

6. The field effect transistor device of claim 1 wherein the oxygen barrier layer is selected from the group consisting of titanium aluminum nitride (TiAlN), tantalum aluminum nitride (TaAlN), tantalum silicon nitride (TaSiN), titanium silicon nitride (TiSiN), hafnium (Hf), zirconium (Zr), hafnium silicide (HfSix), zirconium silicide (ZrSix), titanium silicide (TiSix), niobium-doped titanium silicide, tungsten silicide (WSix), hafnium nitride (HfN), hafnium silicon nitride (HfSiN), zirconium nitride (ZrN), and titanium hafnium nitride (TiHfN).

7. A field effect transistor device comprising:
   a semiconductor substrate;
   a gate stack comprising:
      a gate dielectric layer overlaying the semiconductor substrate;
      an electrically conductive oxygen barrier layer overlaying the gate dielectric layer;
      a low resistivity metal layer overlaying the oxygen barrier layer, wherein each layer in the gate stack has less than 90 atom percent of silicon, germanium or silicon and germanium combined;
      an electrically conducting layer on the low resistivity metal layer; and
      a conducting material layer between the gate dielectric layer and the oxygen barrier layer; and
   a spacer adjacent to the gate stack and in direct contact with each layer of the gate stack.

8. A method for fabricating a field effect transistor device comprising the steps of:
   forming a gate stack on a semiconductor substrate comprising the steps of:
      forming a gate dielectric layer over the semiconductor substrate;
      forming a conducting material layer over the gate dielectric layer;
      forming an electrically conductive oxygen barrier layer over the conducting material layer; and
      forming a low resistivity layer over the oxygen barrier layer, wherein each layer in the gate stack has less than 90 atom percent of silicon, germanium or silicon and germanium combined;
   forming a spacer adjacent to the gate stack and in direct contact with each layer of the gate stack;
   forming an encapsulation layer overlaying the gate stack in contact with the low resistivity layer and in direct contact with the spacer; and
   performing a dopant activation anneal.

9. The method of claim 8 wherein the dopant anneal is an anneal at a temperature greater than 950 C.

10. The method of claim 8 wherein the low resistivity metal layer is selected from the group consisting of tungsten (W) and tantalum (Ta).

11. The method of claim 8 wherein the conducting material layer is selected from the group consisting of titanium nitride, tantalum nitride, titanium silicon nitride, tantalum silicon nitride, titanium carbide, tantalum carbide and combinations thereof.

12. The method of claim 8 wherein the encapsulation layer is selected from the group consisting of silicon nitride, aluminum oxide, hafnium oxide, and zirconium oxide.

13. The method of claim 8 wherein the oxygen barrier layer is selected from the group consisting of titanium aluminum nitride (TiAlN), tantalum aluminum nitride (TaAlN), tantalum silicon nitride (TaSiN), titanium silicon nitride (TiSiN), hafnium (Hf), zirconium (Zr), hafnium silicide (HfSix), zirconium silicide (ZrSix), titanium silicide (TiSix), niobium-doped titanium silicide, tungsten silicide (WSix), hafnium nitride (HfN), hafnium silicon nitride (HfSiN), zirconium nitride (ZrN), and titanium hafnium nitride (TiHfN).

14. The method of claim 8 wherein the oxygen barrier layer is hafnium nitride.

15. A method for fabricating a field effect transistor device comprising the steps of:
   forming a gate stack on a semiconductor substrate comprising the steps of:
      forming a gate dielectric layer over the semiconductor substrate;
      forming a conducting material layer over the gate dielectric layer;
      forming an electrically conductive oxygen barrier layer over the conducting material layer;
      forming a low resistivity layer over the oxygen barrier layer, wherein each layer in the gate stack has less than 90 atom percent of silicon, germanium or silicon and germanium combined; and
      forming an electrically conducting layer over the low resistivity metal layer in the gate stack;
   forming a spacer adjacent to the gate stack and in direct contact with each layer of the gate stack; and
   performing a dopant activation anneal.

* * * * *